US010644239B2

(12) United States Patent
Ghosh et al.

(10) Patent No.: US 10,644,239 B2
(45) Date of Patent: May 5, 2020

(54) HIGH PRECISION, HIGH RESOLUTION COLLIMATING SHADOW MASK AND METHOD FOR FABRICATING A MICRO-DISPLAY

(71) Applicant: eMagin Corporation, Hopewell Junction, NY (US)

(72) Inventors: Amalkumar Ghosh, Hopewell Junction, NY (US); Fridrich Vazan, Pittsford, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 14/941,825

(22) Filed: Nov. 16, 2015

(65) Prior Publication Data

US 2016/0141498 A1    May 19, 2016

Related U.S. Application Data

(60) Provisional application No. 62/080,795, filed on Nov. 17, 2014.

(51) Int. Cl.
*H01L 21/306* (2006.01)
*H01L 51/00* (2006.01)
(Continued)

(52) U.S. Cl.
CPC ........ *H01L 51/0011* (2013.01); *C23C 14/042* (2013.01); *H01L 27/3211* (2013.01)

(58) Field of Classification Search
CPC ............. H01L 51/0011; H01L 27/3211; H01L 21/0234; H01L 21/30604; H01L 21/3065;
(Continued)

(56) References Cited

U.S. PATENT DOCUMENTS 4,393,131 A    7/1983  Whalin et al.
4,902,377 A *  2/1990  Berglund .......... H01L 21/76804
                                                204/192.36
(Continued)

FOREIGN PATENT DOCUMENTS

CN        1461234 A    12/2003
CN        1522098 A     8/2004
(Continued)

OTHER PUBLICATIONS

Hyung-Joon Shin et al, "Patterning of ferroelectric nanodot arrays using a silicon nitride shadow mask"; http://adsabs.harvard.edu/abs/2005ApPhL..87k3114S, "Applied Physics Letters", Sep. 2005, vol. 87, Number Issue 11, id. 113114, Publisher: American Institute of Physics, Published in: KR.

(Continued)

*Primary Examiner* — Thomas T Pham
(74) *Attorney, Agent, or Firm* — Kaplan Breyer Schwarz, LLP

(57) ABSTRACT

The method for producing an OLED micro-display on a silicon wafer uses a collimating shadow mask formed on a silicon substrate. The mask is fabricated by depositing a material layer on the front side and on the back side of the substrate and etching a portion of the layer on the back side of the substrate to a reduced thickness of at least 20 microns. At least one opening is created in the etched portion of the substrate. The substrate beneath the opening is removed to create the mask. The mask is situated at a location spaced from the surface of the silicon wafer and exposed to a linear evaporation source. Organic layers are then deposited on the silicon wafer in a location aligned with the mask opening.

6 Claims, 2 Drawing Sheets

Figure 1:
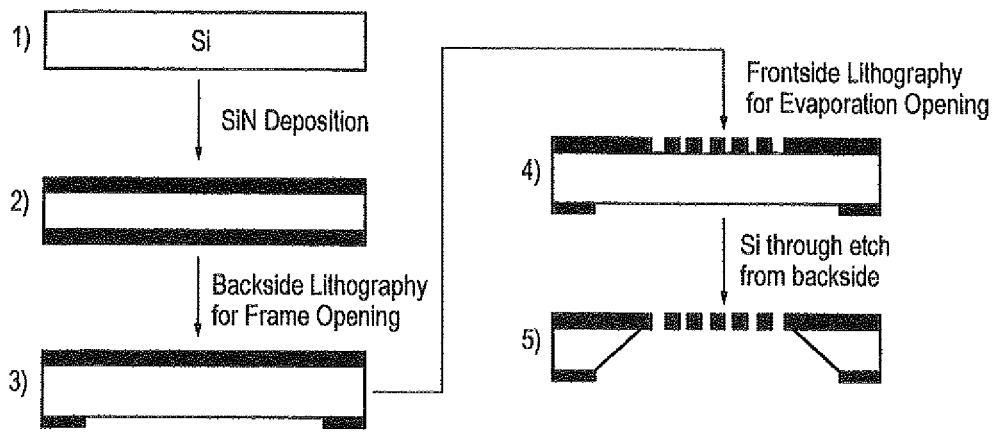

(51) Int. Cl.
*C23C 14/04* (2006.01)
*H01L 27/32* (2006.01)

(58) Field of Classification Search
CPC ......... H01L 21/30655; H01L 21/31053; H01L 21/31055; H01L 21/311; H01L 21/31105; H01L 21/31111; H01L 21/31116; H01L 21/31127; H01L 21/31133; H01L 21/31138; H01L 21/3213; H01L 21/32133; H01L 21/32135; H01L 21/32136; H01L 21/47573
See application file for complete search history.

(56) References Cited

U.S. PATENT DOCUMENTS

| | | | |
|---|---|---|---|
| 5,847,813 | A | 12/1998 | Hirayanagi |
| 6,084,938 | A | 7/2000 | Hara et al. |
| 6,287,436 | B1 | 9/2001 | Pelletier et al. |
| 7,282,240 | B1 | 10/2007 | Jackman et al. |
| 7,615,161 | B2 | 11/2009 | Hoffman |
| 7,977,868 | B2 | 7/2011 | Shieh et al. |
| 8,673,077 | B2 | 3/2014 | Sonoda et al. |
| 8,742,658 | B2 | 6/2014 | Yu et al. |
| 8,879,766 | B1 | 11/2014 | Zhang |
| 8,940,568 | B2 | 1/2015 | Mohan et al. |
| 9,142,779 | B2 | 9/2015 | Chan et al. |
| 2002/0180331 | A1 | 12/2002 | Fukumoto |
| 2004/0142108 | A1 | 7/2004 | Atobe et al. |
| 2004/0197675 | A1 | 10/2004 | Shibata et al. |
| 2004/0219465 | A1* | 11/2004 | Meijer ............... G03F 1/20 430/322 |
| 2005/0212419 | A1 | 9/2005 | Vazan et al. |
| 2007/0024831 | A1 | 2/2007 | Hibbs et al. |
| 2007/0099395 | A1 | 5/2007 | Sridhar et al. |
| 2007/0246705 | A1 | 10/2007 | Li et al. |
| 2009/0091238 | A1 | 4/2009 | Cok et al. |
| 2010/0297349 | A1 | 11/2010 | Lee et al. |
| 2012/0178190 | A1 | 7/2012 | Krijne et al. |
| 2013/0168231 | A1 | 7/2013 | Yang et al. |
| 2013/0320837 | A1 | 12/2013 | Weaver et al. |
| 2013/0344612 | A1 | 12/2013 | Zuo |
| 2014/0342102 | A1 | 11/2014 | Ambrose et al. |
| 2015/0041793 | A1 | 2/2015 | Chan et al. |
| 2015/0275351 | A1* | 10/2015 | Lee ............... C23C 14/24 118/726 |
| 2015/0338751 | A1 | 11/2015 | Ogura et al. |
| 2015/0380652 | A1 | 12/2015 | Chan et al. |
| 2016/0141498 | A1 | 5/2016 | Ghosh et al. |
| 2016/0194747 | A1 | 7/2016 | Kawato et al. |
| 2016/0201195 | A1 | 7/2016 | Lee et al. |
| 2017/0092862 | A1 | 3/2017 | Obata et al. |
| 2017/0342542 | A1 | 11/2017 | Ghosh et al. |
| 2017/0342543 | A1 | 11/2017 | Ghosh et al. |
| 2017/0343901 | A1 | 11/2017 | Ghosh et al. |

FOREIGN PATENT DOCUMENTS

| | | |
|---|---|---|
| CN | 102482759 A | 5/2012 |
| CN | 103282543 A | 9/2013 |
| EP | 2168644 A1 | 3/2010 |
| RU | 2032765 C1 | 4/1995 |
| RU | 2155204 C2 | 8/2000 |
| RU | 2538891 C2 | 1/2015 |
| RU | 2014138799 A | 4/2016 |
| RU | 2588921 C2 | 7/2016 |
| TW | 201100577 A | 1/2011 |
| WO | 2000008228 A1 | 2/2000 |
| WO | 2002024321 A1 | 3/2002 |
| WO | 2010113102 A1 | 10/2010 |

OTHER PUBLICATIONS

Luis Guillermo Villanueva et al, "Resistless Fabrication of Nanoimprint Lithography (NIL) Stamps Using Nano-Stencil Lithography"; http://www.mdpi.com/2072-666X/4/4/370/htm, Micromachines, Oct. 15, 2013, vol. 4(4), 370-377, Publisher: MDPI; doi :10.3390/mi4040370, Published in: CH.

Officer E. Eskina, "International Search Report and the Written Opinion", PCT/US2017/033161, dated Aug. 11, 2017, 9 pages.

Fu-Ching Tung et al., "OLED Fabrication by Using a Novel Planar Evaporation Technique", http://dx/doi.org/10.1155/2014/683037, "International Journal of Photoenergy", dated Jun. 22, 2014, p. 8 vol. 2014, Number Article ID 683037, Publisher: Hindawi Publishing Corporation, Published in: TW.

"Taiwan Office Action", Taiwan Patent Application 106117271, dated Jan. 18, 2018, 18 pp.

Examiner Deoram Persaud, "Non-Final Office Action", U.S. Appl. No. 15/602,939, dated Feb. 23, 2018, 11 pp.

"Non Final Office Action", U.S. Appl. No. 15/597,635, dated Nov. 17, 2017, 15 pp.

Officer A. Pimenova, "International Search Report and the Written Opinion", International Patent Application PCT/US2017/034203, dated Aug. 15, 2017, 8 pp.

Officer A. Pimenova, "International Search Report and the Written Opinion", International Patent Application PCT/IB2017/054481, dated Oct. 25, 2017, 11 pp.

Office Action issued in related Taiwan Application No. 106117271, dated Jan. 17, 2018, pp. 18.

Non-Final Rejection received for U.S. Appl. No. 15/655,544, dated Dec. 26, 2018, 32 pages.

Non-Final Rejection received for U.S. Appl. No. 15/602,939, dated Feb. 25, 2019, 13 pages.

* cited by examiner

HIGH PRECISION, HIGH RESOLUTION COLLIMATING SHADOW MASK AND METHOD FOR FABRICATING A MICRO-DISPLAY

CROSS-REFERENCES TO RELATED APPLICATIONS

This application claims the benefit of provisional patent application Ser. No. 62/080,795 filed in the United States Patent and Trademark Office on Nov. 17, 2014, the entire disclosure of which is incorporated by reference herein.

STATEMENT REGARDING FEDERALLY SPONSORED RESEARCH OR DEVELOPMENT

Not applicable.

THE NAMES OF THE PARTIES TO A JOINT RESEARCH AGREEMENT

Not applicable.

BACKGROUND OF THE INVENTION

1. Field of the Invention

This invention relates to substrate processing, and more particularly, to a high resolution, high precision collimating shadow mask and a method of utilizing such a mask to fabricate a patterned organic light emitting diode (OLED) micro-display.

2. Description of the Related Art

Shadow masks were developed for use in manufacturing cathode ray tube displays for televisions. Early shadow masks consisted of a metal plate punched with tiny holes that separate the colored phosphors in the layer behind the front glass of the screen. Three electron guns at the back of the screen sweep across the mask, with the beams only reaching the screen if they pass through the holes. As the guns are physically separated at the back of the tube, their beams approach the mask from three slightly different angles, so after passing through the holes they hit slightly different locations on the screen.

The screen is patterned with dots of colored phosphor positioned so that each can only be hit by one of the beams coming from the three electron guns. For instance, the blue phosphor dots are hit by the beam from the "blue gun" after passing through a particular hole in the mask. The other two guns do the same for the red and green dots. This arrangement allows the three guns to address the individual dot colors on the screen, even though their beams are much too large and too poorly aimed to do so without the mask in place.

Over the years, as new types of displays have been developed and technologies have evolved for manufacturing displays, the types of shadow masks and the manner in which same are used have changed. Shadow masks are now commonly used in the manufacture of digital displays. However, the current technology for making full color high resolution OLED micro-displays is limited to having a white OLED emitter patterned by color filter layers. Given the current state of the art, this technology is the most feasible way to fabricate full color high resolution OLED micro-displays.

The problem with this type of micro-display is the loss of light emission efficiency. The color filters transmit only about 20% of the light and the rest is absorbed in the filters. This leads to dimmer micro-displays, not suitable for many applications where high luminance is required, such as daylight displays.

An obvious solution to this problem is to remove the color filters but still retain the individually addressable R, G and B primary color sub-pixels. This can be achieved if the white OLED emitter is replaced by individually patterned R, G and B color OLED sub-pixels.

Such methods have been developed and utilized for large area displays which typically have large sub-pixels. For example, LITI (Laser Induced Thermal Imaging) is one of the methods for transferring OLED materials in a patterned form. However, this method is only suitable for large area displays with large sub-pixels, where the dimensional and positioning accuracy is less demanding. When smaller sub-pixels are being created, blurring or "feathering" of the light beam which forms the sub-pixels on the silicon wafer occurs substantially degrading the performance of the display.

Another problem with the LITI method is the change in stoichiometry of the organic materials transferred, which results in compromised display performance. Another method which has been successfully used in patterning large area OLED displays uses a contact metal shadow mask. However, this technology suffers from resolution issues and is not suitable for patterning sub-pixels smaller than 10 by 10 microns.

The present invention relates to a novel high resolution, high precision collimating shadow mask which is uniquely suited for fabrication of smaller patterned OLED micro-displays and to a method of manufacturing smaller patterned OLED micro-displays utilizing the mask. The high precision, high resolution shadow mask of the present invention can be made of Si, Si and $Si_3N_4$, Si and $SiO_2$ or other oxides and materials of high strength and dimensional stability.

It is, therefore, a primary object of the present invention to provide a high precision, high resolution collimating shadow mask.

It is another object of the present invention to provide a high precision, high resolution collimating shadow mask capable of providing sharp and precise definition of the edges of the deposited areas on the substrate without contacting the substrate.

It is another object of the present invention to provide a high precision, high resolution collimating shadow mask capable of eliminating or substantially reducing feathering or image shift due to the angle of deposition.

It is another object of the present invention to provide a high precision, high resolution collimating shadow mask wherein feathering is reduced by increased mask thickness or reduced sub-pixel size.

It is another object of the present invention to provide a high precision, high resolution collimating shadow mask wherein image shift is reduced through the formation of square shaped sub-pixels.

It is another object of the present invention to provide a high precision, high resolution collimating shadow mask capable of achieving high dimensional and positional accuracy without requiring that the mask and substrate be perfectly flat.

It is another object of the present invention to provide a high precision, high resolution collimating shadow mask capable of achieving high dimensional and positional accuracy without requiring the gap between the mask and substrate be perfectly uniform.

BRIEF SUMMARY OF THE INVENTION

One aspect of the present invention relates to a method for fabricating a high precision, high resolution collimating shadow mask on a silicon substrate. The mask is designed for use in producing OLED micro-displays including sub-pixels on a silicon wafer. The method includes the steps of reducing the thickness of the silicon substrate to form an area with a thickness of at least 20 microns and creating at least one opening at a predetermined location on the silicon substrate aligned with reduced thickness area. The silicon substrate under the opening is removed to form the mask. The mask may be aligned with the silicon wafer such that the opening in the mask is in registration with the portion of a silicon wafer where the sub-pixel will be formed during the micro-display fabrication process.

The method further includes the step of depositing a layer of material on a front side of the silicon substrate.

The method also includes depositing a layer of material on the back side of the silicon substrate.

At least a portion of the material is removed from the back side of the substrate, or the deposition layer (if present) and the substrate. Preferably, removal of at least a portion of the material from the back side of the substrate is accomplished by using well-known lithography techniques.

After the thickness of the substrate has been reduced, at least one opening at a predetermined location is created in the reduced thickness area by evaporating a portion of the front side of the silicon substrate (or the layer deposited on the front side of the substrate) to create a membrane with the opening. Preferably, the evaporation step is performed using well-known lithography techniques.

The step of depositing a layer of material on the front side of the silicon substrate includes depositing a layer of silicon oxide or silicon nitrate on the back side of the silicon substrate.

The step of depositing a layer of material on the front side of the silicon substrate includes depositing a layer of material on a front side of the silicon substrate by deposition.

The step of depositing a layer of material on the back side of the silicon substrate includes depositing a layer of silicon oxide or silicon nitrate on the back side of the silicon substrate.

The step of depositing a layer of material on the back side of the silicon substrate includes depositing a layer of material on the back side of the silicon substrate by deposition.

In accordance with another aspect of the present invention, a method of fabricating a color OLED micro-display on a silicon wafer using the collimated shadow mask to reduce feathering is provided. The method includes fabricating a collimated shadow mask on a silicon substrate by reducing the thickness of a silicon substrate to form an area with a thickness of at least 20 microns, creating at least one opening at a predetermined location on the silicon substrate aligned with reduced thickness area and removing the silicon substrate under the opening. The mask is placed at a given distance from the silicon wafer with the opening in the mask aligned with the portion of the silicon wafer where a sub-pixel will be formed. The mask is exposed to a beam from a linear evaporation source and organic materials are deposited to form the sub-pixel. The amount to feathering resulting from this technique equals (b/a) times c, where a=the wafer thickness, b=the wafer size and c=the distance between mask and wafer.

The thickness of the wafer is at least 20 microns.

The sub-pixel created is preferably square and has a size if approximately 5×5 microns or less.

In accordance with another aspect of the present invention, a method is provided for fabricating an OLED micro-display on a silicon wafer using a collimated shadow mask. The shadow mask is formed on a silicon substrate having a front side and the back side. The method includes creating a deposition layer on the front side of the substrate; creating a deposition layer on the back side of the substrate; and etching a substrate to create a reduced thickness layer of at least 20 microns. Thereafter, at least one opening in the reduced thickness layer is created. The substrate material between the area in the front side having the evaporation opening and the back side layer opening is removed to form the shadow mask. The mask is then aligned with the wafer on which the micro-display will be formed and the shadow mask is exposed to the light beam from a linear evaporation source to form the display.

The collimated shadow mask is used in the above fashion produces a high resolution, full color micro-display.

The method further includes positioning the shadow mask at a given distance from the substrate with the mask opening aligned with the wafer location where a sub-pixel will be formed, exposing the shadow mask to a beam from a linear evaporation source, and depositing the organic materials through the mask opening to create an OLED sub-pixel on the wafer.

In accordance with another aspect of the present invention, a method is provided for producing an OLED micro-display on a silicon wafer using a collimating shadow mask formed on a silicon substrate. The method includes depositing a material layer on the front side and on the back side of the substrate and etching a portion of the substrate to a reduced thickness of at least 20 microns. At least one opening is created in the etched portion of the substrate. The substrate under the opening is removed to create the mask. The mask is situated at a location spaced from the surface of the silicon wafer and exposed to a linear evaporation source. Organic layers are then deposited on the silicon wafer in a location aligned with the mask opening.

BRIEF DESCRIPTION OF THE SEVERAL
VIEWS OF THE DRAWINGS

Figure 2:
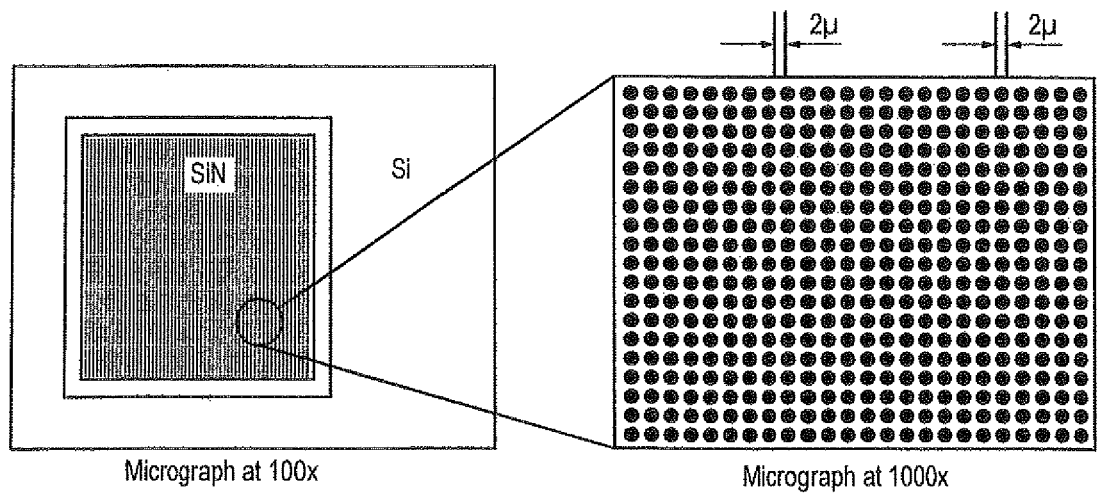
Figure 3:
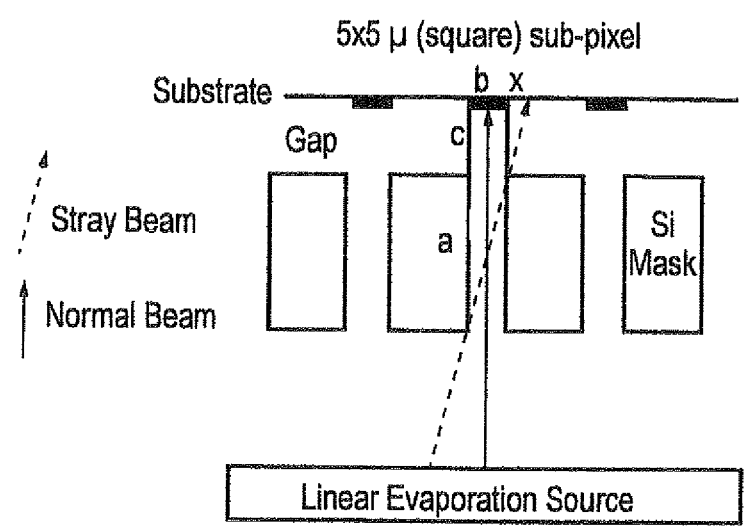

The present invention relates to a high precision, high resolution collimating shadow mask and a method for fabricating a micro-display as described in detail in the following specification and recited in the annexed claims, taken together with the accompanying drawings, in which like numerals refer to like parts in which:

FIG. 1 is a schematic rendering of the steps in the method for creating the collimated shadow mask of the present invention;

FIG. 2 consists of two idealized representations of a micro-display formed in accordance with the present invention shown at 100 times magnification and 1000 times magnification, respectively, and FIG. 3 is a schematic drawing illustrating the manner in which the collimated shadow mask of the present invention is used to reduce feathering in the fabrication of a micro-display.

FIG. 1 illustrates a preferred embodiment of the present invention showing the process flow for the fabrication of a silicon, silicon nitride or silicon oxide shadow mask. In this embodiment, a layer of silicon nitride, silicon oxide or other oxides or material of high strength and dimensional stability is vacuum deposited on the front surface and back surface of a silicon substrate. The back surface of the silicon substrate is then etched in the predetermined areas to a desired thickness by lithography or other similar method to create a "frame" opening.

The evaporation openings, through which the beam from a linear evaporation source will travel during micro-display fabrication, are then etched in the front surface of membrane formed by the remaining silicon, silicon nitride or the silicon oxide. The substrate beneath the openings in the predetermined locations is then removed to form the shadow mask.

It should be noted that while in this preferred embodiment is described as including deposition layers on the front and back surfaces of the silicon substrate, a silicon substrate only one of those layers, or without any coating layers applied could be etched to a desired thickness, the openings in the remaining silicon membrane etched out in the predetermined locations and the substrate beneath the openings removed to form a high precision, high resolution shadow mask.

The mask thickness in the membrane where the evaporation openings are formed, whether it is formed of silicon, silicon nitride, silicon oxide or other material, must be at least 20 microns thick to provide significant collimating properties and a reasonable mask to substrate gap. Organic materials can be then deposited through these precisely located openings for generating patterned OLED sub-pixels.

FIG. 2 is a micrograph showing a top view of a typical silicon nitride shadow mask created by the method of the present invention with the fine holes in it. The mask is shown at 100× magnification and 1000× magnification. In the latter magnification figure it can be seen that the evaporation openings can be as small as approximately 2µ in diameter.

FIG. 3 illustrates how the collimated shadow mask of the present invention may be employed to reduce feathering and image shift in a method of fabricating a color OLED micro-display on a silicon wafer. The method includes fabricating a collimated shadow mask on a silicon substrate as detailed above by reducing the thickness of the silicon substrate to form an area at least 20 microns thick and creating at least one opening at a predetermined location on the silicon substrate aligned with reduced thickness area and removing the substrate beneath the opening.

The mask is placed at a given distance from the substrate of the silicon wafer with the front side facing the wafer substrate and the openings in the mask aligned with the portion of the wafer substrate where the sub-pixels will be formed. The back side of the mask is exposed to a beam from a linear evaporation source and organic materials are deposited to form the sub-pixel.

In this situation, the amount of feathering or image shift can be calculated as equal to (b/a) times c, where a=the wafer thickness, b=the wafer size and c=the distance between mask and wafer. In this case, the thickness b of the wafer is at least 20 microns.

The sub-pixel created is preferably square as opposed to rectangular and preferably has a size if approximately 5×5 microns or less.

Using the high resolution, high precision collimating shadow mask created in accordance with the present invention and phosphorescent organic materials, high resolution and very high brightness micro-displays can be fabricated.

An advantage of directly patterning the OLED layers using this method is that there is no change in stoichiometry of the organic materials and the physics and the chemistry of the materials are also not changed by the shadow mask. As such, OLED display performance should be well maintained and should show no additional degradation in performance due to the fabrication process of the OLED device.

To the accomplishment of the above and related objects the invention may be embodied in the form illustrated in the accompanying drawings. Attention is called to the fact, however, that the drawings are illustrative only.

While only a single preferred embodiment of the present invention has been disclosed for purposes of illustration, it is obvious that many modifications and variations could be made thereto. It is intended to cover all of those modifications and variations, which fall within the scope of the present invention as defined by the following claims.

What is claimed is:

1. A method comprising:
  (1) patterning a first layer disposed on a first surface of a silicon substrate to define a first mask, wherein the first layer consists of silicon nitride and the silicon substrate consists of silicon;
  (2) etching the silicon substrate through the first mask to form a first region that defines a silicon membrane, wherein the silicon substrate has a first thickness outside the first region and a second thickness within the first region, and wherein the second thickness is less than the first thickness and is equal to or greater than 20 microns;
  (3) patterning a second layer disposed on a second surface of the silicon substrate to define a second mask that includes at least one opening; and
  (4) etching the membrane through the second mask to form at least one evaporation opening in the membrane, wherein the at least one evaporation opening has a first lateral dimension that is less than or equal to 10 microns;
  wherein the silicon substrate, the first layer, and the second layer collectively define a shadow mask consisting of silicon and silicon nitride.

2. The method of claim 1 further comprising:
  (5) aligning the membrane and a second substrate; and
  (6) evaporating an organic material onto the first substrate through the at least one evaporation opening.

3. The method of claim 2 wherein the organic material is a light-emitting material.

4. The method of claim 1 wherein the at least one opening is formed such that it has a second lateral dimension that is less than or equal to 10 microns.

5. The method of claim 1 wherein the first lateral dimension is less than or equal to 5 microns.

6. The method of claim 1 wherein the first lateral dimension is within the range from 2 microns to 10 microns.

* * * * *